(12) United States Patent
Cheng et al.

(10) Patent No.: US 9,281,374 B2
(45) Date of Patent: *Mar. 8, 2016

(54) METAL GATE STRUCTURE AND FABRICATION METHOD THEREOF

(71) Applicant: UNITED MICROELECTRONICS CORP., Hsin-Chu (TW)

(72) Inventors: Tsun-Min Cheng, Changhua County (TW); Min-Chuan Tsai, New Taipei (TW); Chih-Chien Liu, Taipei (TW); Jen-Chieh Lin, Kaohsiung (TW); Pei-Ying Li, Tainan (TW); Shao-Wei Wang, Taichung (TW); Mon-Sen Lin, Ping-Tung (TW); Ching-Ling Lin, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/490,679

(22) Filed: Sep. 19, 2014

(65) Prior Publication Data

US 2015/0004780 A1 Jan. 1, 2015

Related U.S. Application Data

(62) Division of application No. 13/214,260, filed on Aug. 22, 2011, now Pat. No. 8,872,286.

(51) Int. Cl.
| | |
|---|---|
| H01L 29/49 | (2006.01) |
| H01L 29/423 | (2006.01) |
| H01L 29/43 | (2006.01) |
| H01L 29/772 | (2006.01) |
| H01L 29/66 | (2006.01) |

(Continued)

(52) U.S. Cl.
CPC ...... *H01L 29/4966* (2013.01); *H01L 21/82345* (2013.01); *H01L 29/4232* (2013.01); *H01L 29/435* (2013.01); *H01L 29/66045* (2013.01); *H01L 29/66545* (2013.01); *H01L 29/78* (2013.01); *H01L 21/823842* (2013.01); *H01L 21/823857* (2013.01); *H01L 29/51* (2013.01)

(58) Field of Classification Search
None
See application file for complete search history.

(56) References Cited

U.S. PATENT DOCUMENTS

| 6,066,533 A | 5/2000 | Yu |
| 6,492,217 B1 | 12/2002 | Bai |

(Continued)

FOREIGN PATENT DOCUMENTS

| TW | 200539277 | 12/2005 |
| TW | 201010008 | 3/2010 |
| TW | 201118951 | 6/2011 |

OTHER PUBLICATIONS

Xueli, M., et. al. "An Effective work-function tuning method of nMOSCAP with high-k metal gate by TiN/TaN double layer stack Thickness", J. of Semiconductors, vol. 35, No. 9 Sep. 2014, pp. 096001-4.*

(Continued)

*Primary Examiner* — Joseph Schoenholtz
(74) *Attorney, Agent, or Firm* — Winston Hsu; Scott Margo

(57) ABSTRACT

A metal gate structure located on a substrate includes a gate dielectric layer, a metal layer and a titanium aluminum nitride metal layer. The gate dielectric layer is located on the substrate. The metal layer is located on the gate dielectric layer. The titanium aluminum nitride metal layer is located on the metal layer.

15 Claims, 4 Drawing Sheets

(51) Int. Cl.
*H01L 29/78* (2006.01)
*H01L 29/51* (2006.01)
*H01L 21/8238* (2006.01)
*H01L 21/8234* (2006.01)

(56) References Cited

U.S. PATENT DOCUMENTS

| | | |
|---|---|---|
| 6,552,377 B1 | 4/2003 | Yu |
| 6,696,345 B2 | 2/2004 | Chau |
| 6,790,719 B1 | 9/2004 | Adetutu |
| 6,794,234 B2 | 9/2004 | Polishchuk |
| 6,902,969 B2 | 6/2005 | Adetutu |
| 6,921,711 B2 | 7/2005 | Cabral, Jr. |
| 7,030,430 B2 | 4/2006 | Doczy |
| 7,074,664 B1 | 7/2006 | White |
| 7,109,079 B2 | 9/2006 | Schaeffer, III |
| 7,126,199 B2 | 10/2006 | Doczy |
| 7,157,378 B2 | 1/2007 | Brask |
| 7,193,893 B2 | 3/2007 | Forbes |
| 7,208,366 B2 | 4/2007 | Tsai |
| 7,381,619 B2 | 6/2008 | Wang |
| 7,390,709 B2 | 6/2008 | Doczy |
| 7,488,656 B2 | 2/2009 | Cartier |
| 7,785,958 B2 | 8/2010 | Doczy |
| 8,129,280 B2 | 3/2012 | Wang |
| 8,198,151 B2 | 6/2012 | Lin |
| 8,647,972 B1 * | 2/2014 | Ando et al. ............ 438/589 |
| 8,659,077 B1 * | 2/2014 | Ando et al. ............ 257/330 |
| 8,872,286 B2 * | 10/2014 | Cheng et al. .......... 257/412 |
| 2002/0127888 A1 | 9/2002 | Cho |
| 2005/0064690 A1 | 3/2005 | Amos |
| 2005/0095763 A1 | 5/2005 | Samavedam |
| 2005/0202659 A1 | 9/2005 | Li |
| 2005/0275035 A1 | 12/2005 | Mathew |
| 2006/0040482 A1 | 2/2006 | Yang |
| 2006/0054943 A1 | 3/2006 | Li |
| 2006/0138670 A1 | 6/2006 | Lee |
| 2007/0037335 A1 | 2/2007 | Chambers |
| 2007/0082445 A1 | 4/2007 | Yang |
| 2007/0138559 A1 | 6/2007 | Bohr |
| 2007/0148838 A1 | 6/2007 | Doris |
| 2007/0210354 A1 | 9/2007 | Nabatame |
| 2008/0076216 A1 | 3/2008 | Pae |
| 2008/0318371 A1 | 12/2008 | Lin |
| 2009/0057769 A1 | 3/2009 | Wei |
| 2009/0057787 A1 | 3/2009 | Matsuki |
| 2009/0166769 A1 | 7/2009 | Metz |
| 2010/0052074 A1 | 3/2010 | Lin |
| 2010/0068877 A1 | 3/2010 | Yeh |
| 2010/0081262 A1 | 4/2010 | Lim |
| 2010/0140717 A1 | 6/2010 | Lavoie |
| 2011/0006354 A1 | 1/2011 | Jangjian |
| 2011/0014773 A1 * | 1/2011 | Lin et al. ............ 438/424 |
| 2011/0156107 A1 | 6/2011 | Bohr |
| 2011/0215409 A1 * | 9/2011 | Li et al. ............ 257/351 |
| 2012/0223397 A1 * | 9/2012 | Yang et al. ............ 257/411 |
| 2012/0292721 A1 * | 11/2012 | Huang et al. ............ 257/412 |
| 2012/0313178 A1 * | 12/2012 | Liao et al. ............ 257/368 |
| 2013/0015580 A1 * | 1/2013 | Jain et al. ............ 257/751 |
| 2013/0026578 A1 | 1/2013 | Tsau |
| 2013/0075831 A1 * | 3/2013 | JangJian et al. ............ 257/410 |
| 2014/0361386 A1 * | 12/2014 | Huang et al. ............ 257/412 |

OTHER PUBLICATIONS

Zhang, Z., et. al., "Investigation of Thermal Stability of RFPVD TiAl Metal Alloy", ECS Trans. 2012 vol. 44, issue 1, 401-405.*

T. Ando, "Ultimate scaling of high-K gate dielectrics: Higher-K or interfacial layer scavenging?" Materials, vol. 5, No. 3, pp. 478-500, Mar. 2012.*

Ando, T.; Cartier, E.A.; Bruley, J.; Kisik Choi; Narayanan, V., "Origins of Effective Work Function Roll-Off Behavior for High-K Last Replacement Metal Gate Stacks," Electron Device Letters, IEEE, vol. 34, No. 6, pp. 729,731, Jun. 2013.*

Hsieh et al., "Process Development of High-k Metal Gate Aluminum Cmp at 28nm Technology Node", Advanced Metallization Conference-2010, 2010, p. 1-28.

Huang et al., "Flat-band voltage shift in metal-gate/high-k/Si stacks", Chin. Phys. B, vol. 20, No. 9 (2011), 097303, p. 1-11.

Iwai, H., "High-k/Metal Gate Technology", Frontier Research Center, Tokyo Institute of Technology, Jan. 9, 2008.

Niwa, M., "Development of 32nm CMOS and Recent Trend for Beyond 32nm", 7th Annual Sematech Symposium, Tokyo Japan, Jun. 22, 2011.

Kim, J.Y., et al., "Comparison of TiN and TiAlN as a Diffusion Barrier Deposited by Atomic Layer Deposition", Journal of the Korean Physical Society, vol. 40, No. 1, Jan. 2002, pp. 176-179.

Lin, K.H., et al., "Investigation of PVD TiN Process for 28nm Hi-K PMOS Effective Work Function Enhancement", Sematech Advanced Metallization Conference, Albany NY., Oct. 7, 2010.

Cha et al., "Work function and thermal stability of Ti 1-x Al x N y for dual metal gate electrodes", Applied Physics Letters, vol. 81, No. 22, pp. 4192-4194, Nov. 25, 2002.

Ni et al., "Gate-First TiAlN P-Gate Electrode for Cost Effective High-k Metal Gate Implementation", IEEE, 2012.

Verghese, "Atomic layer deposition for metal gate integration", Solid State Technology, Jul. 2012.

J.T. Chen et al., "Characterization and temperature controlling property of TiAlN coatings deposited by reactive magnetron co-sputtering", Jun. 12, 2008, pp. 91-96, Journal of Alloys and Compounds 472.

"Synthesis and Application of TiAlN/CrN Multilayered Coatings by a Cathodic Arc Deposition Process" Journal of Science and Engineering Technology, vol. 1, No. 2, pp. 2-3 (2005).

* cited by examiner

METAL GATE STRUCTURE AND FABRICATION METHOD THEREOF

CROSS REFERENCE TO RELATED APPLICATIONS

This application is a divisional application of and claims the benefit of U.S. patent application Ser. No. 13/214,260, filed Aug. 22, 2011.

BACKGROUND OF THE INVENTION

1. Field of the Invention

The present invention relates generally to a metal gate structure and fabrication method thereof, and more specifically, to a metal gate structure and fabrication method thereof using a titanium aluminum nitride metal layer as a barrier layer and a portion of a work function metal layer.

2. Description of the Prior Art

Poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effect. This increases equivalent thickness of the gate dielectric layer, reduces gate capacitance, and worsens a driving force of the devices. Therefore, work function metals that are suitable for use as the high-K gate dielectric layer are used to replace the conventional poly-silicon gate to be the control electrode.

In a complementary metal-oxide semiconductor (CMOS) device, one of the dual work function metal gates is used in an NMOS device and the other one is used in a PMOS device. It is well known that compatibility and process control for the dual metal gate is more complicated, while thickness and composition controls for materials used in the dual metal gate method are more precise.

SUMMARY OF THE INVENTION

The present invention provides a metal gate structure and fabrication method thereof to solve these aforesaid problems.

The present invention provides a metal gate structure located on a substrate. The metal gate structure includes a gate dielectric layer, a metal layer and a titanium aluminum nitride metal layer. The gate dielectric layer is located on the substrate. The metal layer is located on the gate dielectric layer. The titanium aluminum nitride metal layer is located on the metal layer.

The present invention provides a metal gate process including the following steps. A substrate is provided. A gate dielectric layer is formed on the substrate. A titanium aluminum metal layer is formed on the gate dielectric layer. A titanium aluminum nitride metal layer is formed in-situ on the titanium aluminum metal layer.

The present invention provides a metal gate process including the following steps. A substrate is provided. A gate dielectric layer is formed on the substrate. A titanium aluminum metal layer is formed on the gate dielectric layer. A plasma nitridation process is performed for transforming the surface of the titanium aluminum metal layer into a titanium aluminum nitride metal layer.

The present invention therefore provides a metal gate structure, having a titanium aluminum nitride metal layer on the metal layer, and a fabrication method thereof. The titanium aluminum nitride metal layer can have dual capabilities of a work function metal layer and a barrier layer. Therefore, a portion of the (work function) metal layer can be replaced, meaning the thickness of the (work function) metal layer can be reduced. Due to the titanium aluminum nitride metal layer being able to be used as a barrier layer, the purpose of avoiding the ingredients of the electrode layer formed thereon from diffusing downward and polluting the metal gate structure beneath the titanium aluminum nitride metal layer can be achieved without further forming a barrier layer. The present invention thereby solves these problems of the prior art without reducing the process throughput.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
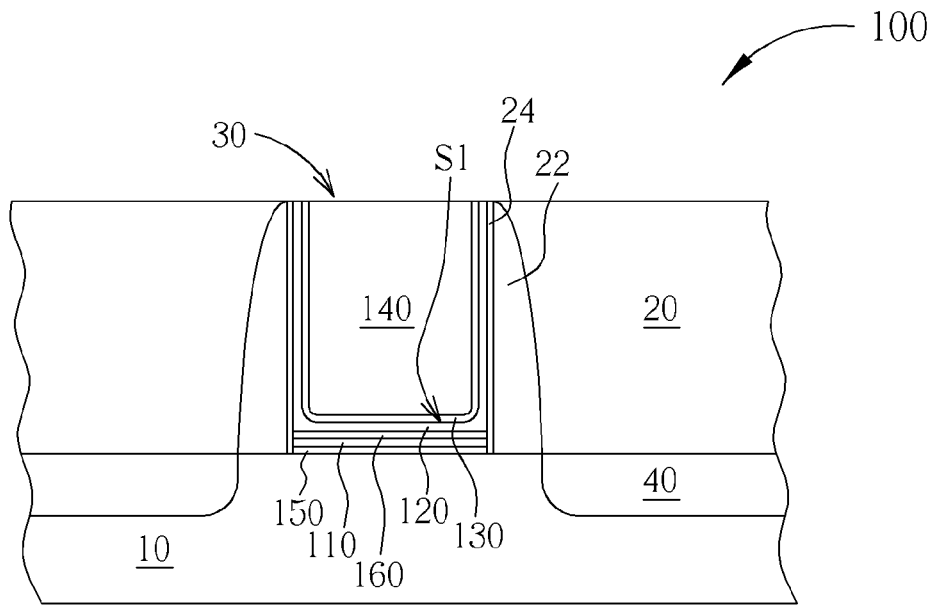
FIG. 1 schematically depicts a cross-sectional view of a metal gate structure according to one preferred embodiment of the present invention.

FIG. 1 schematically depicts a cross-sectional view of a metal gate structure according to one preferred embodiment of the present invention, wherein the metal gate structure of FIG. 1 is formed by gate-last for high-k first processes. As shown in FIG. 1, a metal gate structure 100 is located on a substrate 10 and in a gate recess 30 surrounded by an inter-dielectric layer 20. The metal gate structure 100 includes a gate dielectric layer 110, a metal layer 120 and a titanium aluminum nitride metal layer 130. The gate dielectric layer 110 is located on the substrate 10. The metal layer 120 is located on the gate dielectric layer 110. The titanium aluminum nitride metal layer 130 is located on the metal layer 120. The electrode layer 140 is located on the titanium aluminum nitride metal layer 130. The titanium aluminum nitride metal layer 130 may be formed by a physical vapor deposition (PVD) process. The metal gate structure 100 may further include a spacer 22 and a sealing layer 24. The sealing layer 24 is located beside the gate dielectric layer 110, the metal layer 120, the titanium aluminum nitride metal layer 130 and the electrode layer 140. The spacer 22 is located beside the sealing layer 24. The forming methods of the other components of the metal gate structure 100 are known in the art, and therefore not described herein.

The substrate 10 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The gate dielectric layer 110 may be a dielectric layer having a high dielectric constant, such as the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST). In this embodiment, the metal layer 120 is a work function metal layer, wherein the work function metal layer may be a titanium aluminum metal layer suited for applying to an NMOS transistor; or the work function metal layer may be a titanium nitride metal layer suited for applying to a PMOS transistor. The metal layer 120 may be another metal layer suited for applying to another semiconductor structure, and is not restricted in the present invention. The electrode layer 140 may be a main electrode layer such as an aluminum electrode layer. The inter-dielectric layer 20 may be a silicon oxide layer. The spacer and the sealing layer 24 may be single layer structures or multilayer structures composed of materials such as silicon nitride or silicon oxide.

It is emphasized herein that the titanium aluminum nitride metal layer 130 has the capabilities of both a work function metal layer and a barrier layer. By forming the titanium aluminum nitride metal layer 130 on the metal layer 120, not only can the titanium aluminum nitride metal layer 130 function as a work function metal layer, but it can also prevent the ingredients of the electrode layer 140 on the titanium aluminum nitride metal layer 130 from diffusing downward, which leads to pollution of the components of the metal gate structure 100 beneath the titanium aluminum nitride metal layer 130, such as the gate dielectric layer 110 and reduces the performance of the metal gate structure 100. For instance, as the titanium aluminum nitride metal layer 130 of the preset invention is applied to an NMOS transistor, the work function of the NMOS transistor can achieve 4.2 eV. The titanium aluminum nitride metal layer 130 also has a good barrier property. According to experiments, the titanium aluminum nitride metal layer 130 can even avoid highly active and small molecules such as hydrogen from passing through. The titanium aluminum nitride metal layer 130 can thereby stop metals of the electrode layer 140 from diffusing downward.

In this embodiment, wherein the metal layer 120 being a titanium aluminum metal layer is formed and then a metal gate structure 100 of an NMOS transistor is formed, the titanium aluminum nitride metal layer 130 can be formed by nitridizing the surface of the metal layer 120. There are two nitridation methods described as two embodiments in the following. Additionally, the titanium aluminum nitride metal layer 130 may be directly formed on the metal layer 120, or formed by transforming the metal layer 120 through other chemical methods; the methods are not limited thereto.

The First Embodiment

The substrate 10 is provided. The gate dielectric layer 110 is formed on the substrate 10. An aluminum titanium metal layer (corresponding to the metal layer 120) is formed on the gate dielectric layer 110. The titanium aluminum nitride metal layer 130 is formed in-situ on the aluminum titanium metal layer. The electrode layer 140 such as an aluminum metal layer is formed on the titanium aluminum nitride metal layer. The method of forming the titanium aluminum nitride metal layer 130 may be: importing nitrogen gas on the surface S1 of the aluminum titanium metal layer and transforming a portion of the aluminum titanium metal layer into the titanium aluminum nitride metal layer. In one embodiment, the aluminum titanium metal layer is formed by a physical vapor deposition (PVD) process. The target of the physical vapor deposition process may be one target composed of a titanium aluminum alloy; or it may be a plurality of targets respectively composed of aluminum and titanium, which form a titanium aluminum metal layer by adjusting the sputtering ratio of the aluminum target and the titanium target. In this way, a titanium aluminum nitride metal layer 130 can be deposited on the titanium aluminum metal layer by importing nitrogen gas in-situ in one chamber, wherein the nitrogen gas reacts to the titanium aluminum target or to the aluminum target and the titanium target, so that the titanium aluminum nitride metal layer 130 can be deposited after the titanium aluminum metal layer is formed.

The Second Embodiment

The substrate 10 is provided. The gate dielectric layer 110 is formed on the substrate 10. The titanium aluminum metal layer (corresponding to the metal layer 120) is formed on the gate dielectric layer 110. A plasma nitridation process is performed to transform the surface S1 of the titanium aluminum metal layer into a titanium aluminum nitride metal layer 130. The electrode layer 140 such as an aluminum metal layer is formed on the titanium aluminum nitride metal layer 130. In one case, a plasma nitridation process may be a decoupled plasma nitridation process, but it is not limited thereto. The nitridation process, which can nitridize the surface of the titanium aluminum metal layer, can be applied to the present invention.

Furthermore, the metal gate structure 100 may further include a buffer layer 150 located between the substrate 10 and the gate dielectric layer 110 for buffering the structure difference of the substrate 10 and the gate dielectric layer 110. Otherwise, the metal gate structure 100 may further include a barrier layer 160 located between the gate dielectric layer 110 and the metal layer 120, wherein the barrier layer 160 may be a single layer structure composed of tantalum nitride, or a multilayer structure composed of tantalum nitride and titanium nitride. A spacer 22 may be located beside the metal gate structure 100. Otherwise, a source/drain region 40 may be located in the substrate 10 next to the spacer 22, and a salicide (not shown) or a contact etch stop layer (CESL) (not shown) etc., may be located on the source/drain region 40. The source/drain region 40 of a PMOS transistor is preferred to include a silicon germanium (SiGe) structure, and the source/drain region 40 of an NMOS transistor is preferred to include a silicon carbide (SiC) structure Due to the metal gate structure 100 being formed by applying gate-last for high-k first processes in this embodiment, the metal layer 120 and the titanium aluminum nitride metal layer 130 of this embodiment all have a U-shaped profile structure and the gate dielectric layer 110 has a "—" shaped profile structure. The barrier layer 160 formed on the gate dielectric layer 110 also has a "—" shaped profile structure. AS the barrier layer 160 is a multilayer structure, the bottom layer of the barrier layer 160 may has a "—" shaped profile structure and the upper layer of the barrier layer 160 may has a U-shaped profile structure.

Figure 2:
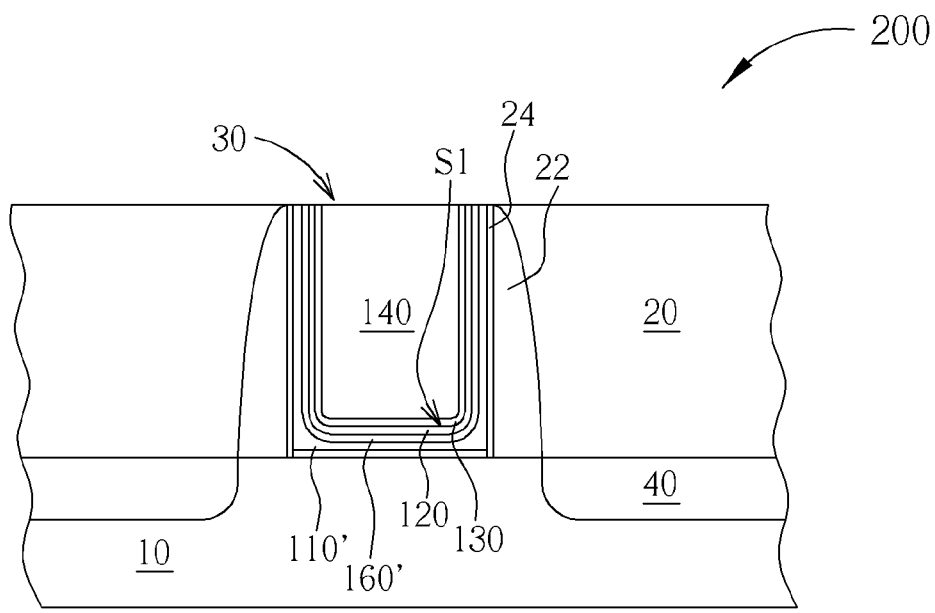
FIG. 2 schematically depicts a cross-sectional view of a metal gate structure according to one preferred embodiment of the present invention.

As the metal gate structure 200 is formed by applying gate-last for high-k last process, the metal gate structure 200 would be a structure as shown in FIG. 2. The gate dielectric layer 110' located on the substrate 10 has a U-shaped profile structure and the barrier layer 160' located on the gate dielectric layer 110' also has a U-shaped profile structure. The metal layer 120 and the titanium aluminum nitride metal layer 130 have a U-shaped profile structure as well.

The metal gate structure 100 or the metal gate structure 200 is also suited for being a metal gate structure of a PMOS transistor and an NMOS transistor in a CMOS transistor. FIGS. 3-8 depict a cross-sectional view of a CMOS transistor process according to one embodiment of the present invention, which applies gate-last for high-k first process as an example to form the metal gate structure 100.

Figure 3:
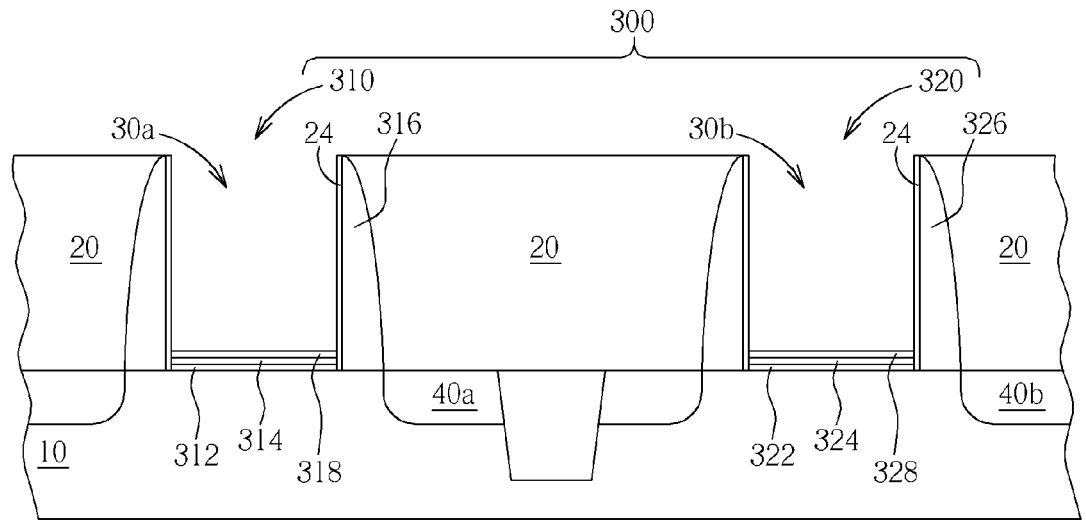
FIG. 3 schematically depicts a cross-sectional view of a CMOS transistor process according to one preferred embodiment of the present invention.

As shown in FIG. 3, the CMOS transistor 300 includes an NMOS transistor 310 and a PMOS transistor 320 formed on a substrate 10. A buffer layer (not shown) is selectively formed on the substrate 10, and then a gate dielectric layer (not shown) is formed thereon. A sacrificed gate layer (not shown) is formed on the gate dielectric layer. The sacrificed gate layer, the gate dielectric layer and the buffer layer are sequentially patterned to form two buffer layers 312 and 322, two gate dielectric layers 314 and 324, and two patterned sacrificed gate layers (not shown). Two spacers 316 and 326 are respectively formed beside the patterned sacrificed gate layers and two source/drain region 40a and 40b are respectively formed by performing an ion implantation process. A metal salicide (not shown), a contact etch stop layer (CESL) (not shown) and an inter-dielectric layer 20 may be sequentially formed and a planarization process is performed. Then, two gate recesses 30a and 30b are formed after the patterned sacrificed gate layers are removed by methods such as etching, for filling metal gates in the following processes. In addition, two barrier layers 318 and 328 may be selectively formed on the gate dielectric layers 314 and 324 for isolating the gate dielectric layer 314 and 324 from the sacrificed gate layer.

Figure 4:
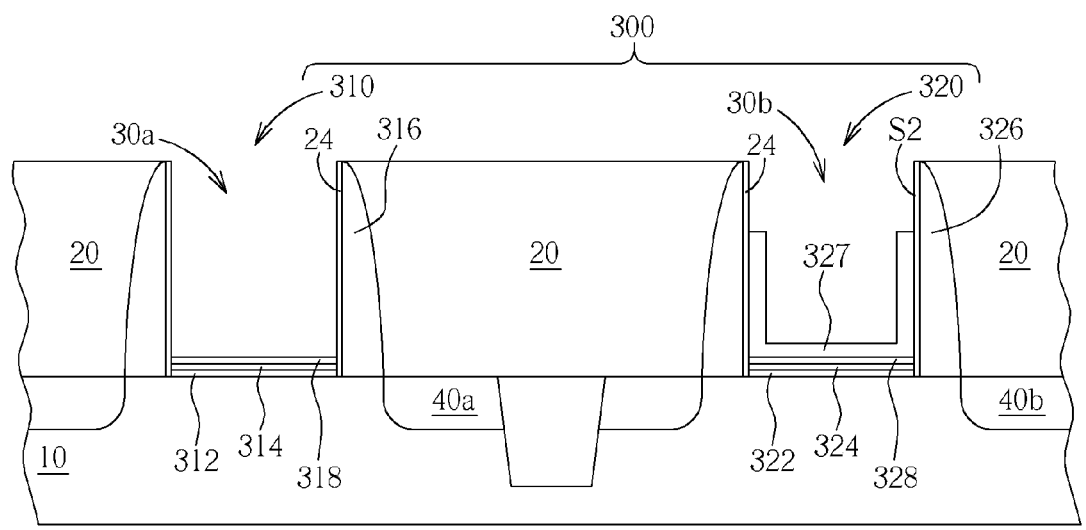
FIG. 4 schematically depicts a cross-sectional view of a CMOS transistor process according to one preferred embodiment of the present invention.

As shown in FIG. 4, a first work function metal layer 327 is formed in the gate recess 30b, wherein the forming method of the first work function metal layer 327 may be: entirely covering a first work function metal layer on the sidewall and the bottom of the gate recess 30a and 30b, and then etching back the first work function metal layer by a filling layer (not shown) to reserve the first work function metal layer 327 in the gate recess 30b only and expose a part of the sidewall S2 of the gate recess 30b. When using the PMOS transistor 320 in this embodiment, the material of the first work function metal layer 327 may be titanium nitride, but it is not limited thereto.

Figure 5:
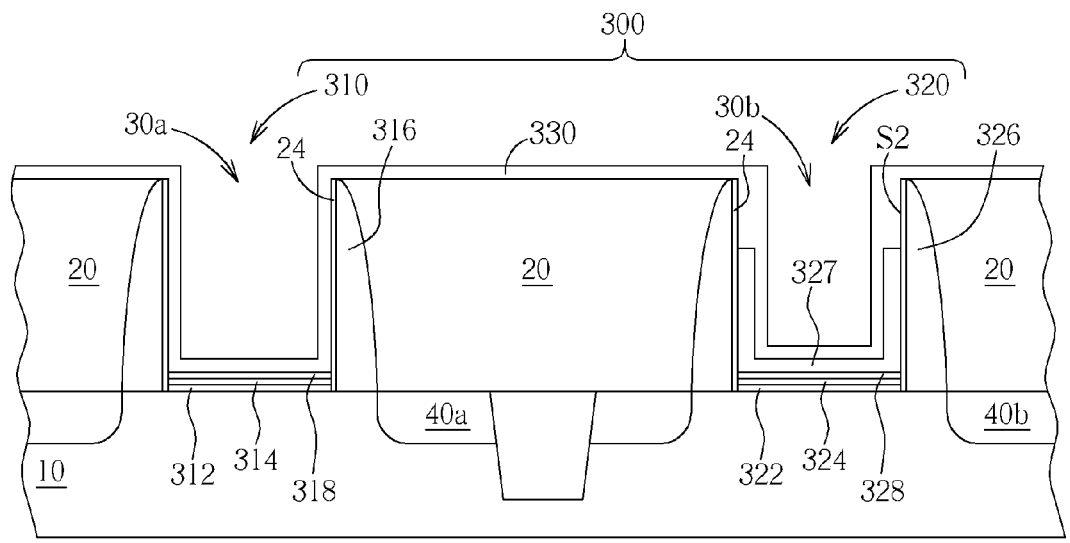
FIG. 5 schematically depicts a cross-sectional view of a CMOS transistor process according to one preferred embodiment of the present invention.

As shown in FIG. 5, a second work function metal layer 330 is formed to cover the surface of the gate recess 30a and 30b and the inter-dielectric layer 20, wherein the material of the second work function metal layer 330 in this embodiment is titanium aluminum for pairing with the NMOS transistor 310, but it is not limited thereto.

Figure 6:
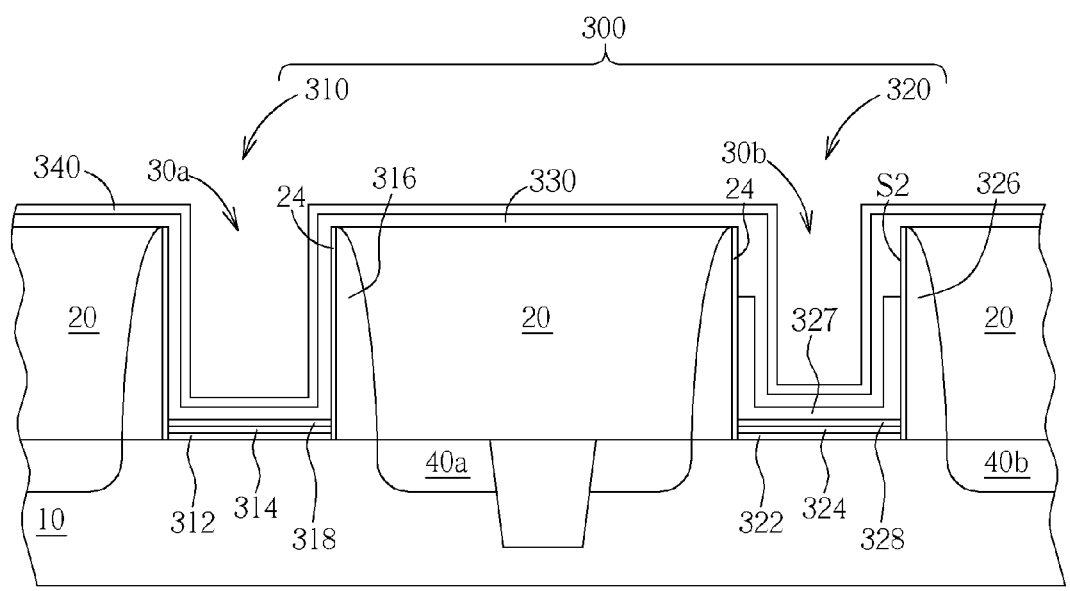
FIG. 6 schematically depicts a cross-sectional view of a CMOS transistor process according to one preferred embodiment of the present invention.

As shown in FIG. 6, a titanium aluminum nitride metal layer 340 is formed to cover the second work function metal layer 330. The titanium aluminum nitride metal layer 340 can be formed by the aforementioned methods.

Figure 7:
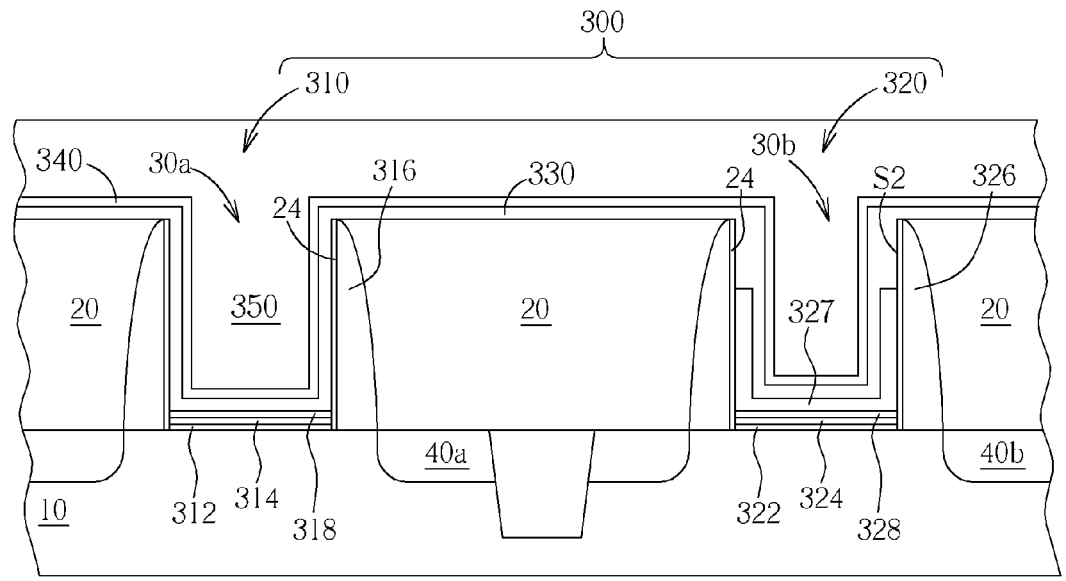
FIG. 7 schematically depicts a cross-sectional view of a CMOS transistor process according to one preferred embodiment of the present invention.

As shown in FIG. 7, a main electrode layer 350 is formed to cover the titanium aluminum nitride metal layer 340, wherein the main electrode layer 350 may be a low resistant electrode layer such as an aluminum layer or a copper layer. The electrode layer processes that accompany the aluminum layer or the copper layer known in the art, e.g. forming barrier layers such as titanium layers, titanium nitride layers, tantalum layers, or tantalum nitride layers, may be selectively performed to prevent the metal atoms from diffusing.

It should be noted that the first work function metal layer 327 and the second work function metal layer 330 that fill in the NMOS transistor 310 and the PMOS transistor 320 (especially for the PMOS transistor 320) as shown in FIGS. 3-8 and even the gate dielectric layer form by applying gate-last for high-k last processes all have a U-shaped profile structure, which cause the opening size of the gate recess 30a and 30b to shrink. As the size of the gate recess 30a and 30b shrinks depends upon the shrinking of the semiconductor device, the main electrode layer 350 will have difficulty filling in the gate recess 30a and 30b because of the small opening of the gate recess 30a and 30b.

The present invention solves this problem by forming the titanium aluminum nitride metal layer 340 on the second work function metal layer 330. Because the titanium aluminum nitride metal layer 340 has dual capabilities of a work function metal layer and a barrier layer, a portion of the second work function metal layer 330 can be replaced by the titanium aluminum nitride metal layer 340, meaning the thickness of the second work function metal layer 330 can be reduced, and a barrier layer does not need to be further formed on the second work function metal layer 330. As the second work function metal layer 330 is a titanium aluminum metal layer, the titanium aluminum nitride metal layer 340 can be formed in the same chamber for forming the second work function metal layer 330, meaning the processing time and the processing cost can be reduced.

Figure 8:
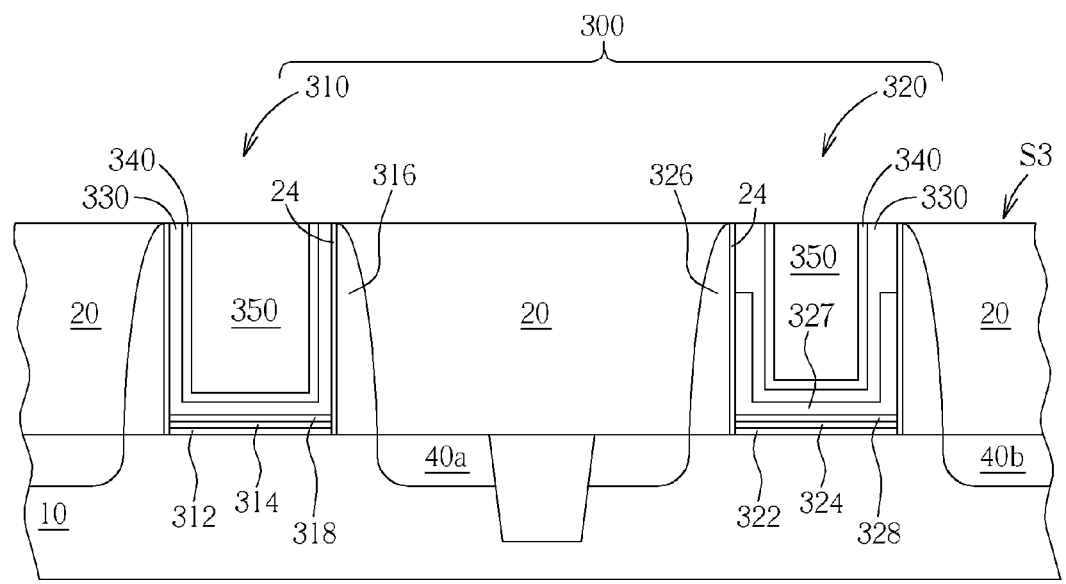
FIG. 8 schematically depicts a cross-sectional view of a CMOS transistor process according to one preferred embodiment of the present invention.

As shown in FIG. 8, the second work function metal layer 330, the titanium aluminum nitride metal layer 340 and the main electrode layer 350 covering the surface S3 of the inter-dielectric layer 20 may be planarized by methods such as a chemical mechanical polishing (CMP) process.

The present invention therefore provides a metal gate structure, having the titanium aluminum nitride metal layer as both a barrier layer and a portion of the work function metal layer, and a fabrication method thereof. The titanium aluminum nitride metal layer can replace a portion of the work function metal layer, and thereby the thickness of the work function metal layer is reduced. The titanium aluminum nitride metal layer can also be used as a barrier layer, so that the purpose of avoiding the ingredients of the electrode layer formed thereon from diffusing downward and polluting the metal gate structure beneath the titanium aluminum nitride metal layer can be achieved without further forming a barrier layer. Thus, the present invention can solve the problem of filling difficulty of the electrode layer without reducing the process throughput.

If the titanium aluminum nitride metal layer is formed by nitridizing the work function metal layer such as a titanium aluminum metal layer, the titanium aluminum nitride metal layer can be formed in the same chamber as the work function metal layer, meaning the processing time and the processing cost can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A first and second metal gate process, comprising:
providing a substrate;
forming a gate dielectric layer on the substrate;
forming a barrier layer on the gate dielectric layer;
forming a first work function metal layer on a part of the barrier layer;

forming a titanium aluminum metal layer on the barrier layer and the first work function metal layer for serving as a second work function layer; and forming a titanium aluminum nitride metal layer having a U-shaped profile structure in-situ directly on the titanium aluminum metal layer, so that the first metal gate structure comprises the gate dielectric layer, the barrier layer, the first work function metal layer, the second work function metal layer and the titanium aluminum nitride metal layer, and the second metal gate structure comprises the gate dielectric layer, the barrier layer, the second work function metal layer and the titanium aluminum nitride metal layer.

2. The metal gate process according to claim 1, wherein forming the titanium aluminum metal layer in-situ comprises performing a Physical Vapor Deposition (PVD) process.

3. The metal gate process according to claim 2, wherein the target of the Physical Vapor Deposition (PVD) process comprises a titanium aluminum target.

4. The metal gate process according to claim 2, wherein the target of the Physical Vapor Deposition (PVD) process comprises an aluminum target and a titanium target.

5. The metal gate process according to claim 1, wherein forming the titanium aluminum nitride metal layer in-situ comprises importing nitrogen gas into the surface of the titanium aluminum metal layer, to transform the titanium aluminum metal layer into the titanium aluminum nitride metal layer.

6. The metal gate process according to claim 2, wherein forming the titanium aluminum metal layer and forming the titanium aluminum nitride metal layer in-situ are both performed in the same chamber.

7. The metal gate process according to claim 1, further comprising:
    after forming the titanium aluminum nitride metal layer in-situ, forming an electrode layer on the titanium aluminum nitride metal layer.

8. A first and second metal gate process, comprising:
    providing a substrate;
    forming a gate dielectric layer on the substrate;
    forming a barrier layer on the gate dielectric layer;
    forming a first work function metal layer on a part of the barrier layer;
    forming a titanium aluminum metal layer on the barrier layer and the first work function metal layer for serving as a second work function layer; and
    performing a plasma nitridation process for transforming the surface of the titanium aluminum metal layer into a titanium aluminum nitride metal layer having a U-shaped profile structure, so that the first metal gate structure comprises the gate dielectric layer, the barrier layer, the first work function metal layer, the second work function metal layer and the titanium aluminum nitride metal layer, and the second metal gate structure comprises the gate dielectric layer, the barrier layer, the second work function metal layer and the titanium aluminum nitride metal layer.

9. The metal gate process according to claim 8, wherein the plasma nitridation process comprises a decoupled plasma nitridation process.

10. The metal gate process according to claim 8, further comprising:
    after performing the plasma nitridation process, forming an electrode layer on the titanium aluminum nitride metal layer.

11. A metal gate structure located on a substrate, comprising:
    a gate dielectric layer located on the substrate;
    a barrier layer located on the gate dielectric layer;
    a work function metal layer having a U-shaped profile structure and located on the barrier layer;
    a titanium aluminum nitride metal layer having a U-shaped profile structure and located on the work function metal layer; and
    an electrode layer having a bulk-shaped profile structure and located on the titanium aluminum nitride metal layer, thereby forming the metal gate structure being a metal gate structure of an NMOS transistor.

12. The metal gate structure according to claim 11, wherein the work function metal layer comprises a titanium aluminum metal layer.

13. The metal gate structure according to claim 11, wherein the gate dielectric layer comprises a dielectric layer having a high dielectric constant.

14. The metal gate structure according to claim 13, wherein the gate dielectric layer further comprises a buffer layer located between the substrate and the dielectric layer having a high dielectric constant.

15. The metal gate structure according to claim 11, wherein the gate dielectric layer has a U-shaped profile structure.

* * * * *